United States Patent
Wu et al.

(10) Patent No.: US 9,048,373 B2
(45) Date of Patent: Jun. 2, 2015

(54) EVAPORATION APPARATUS AND METHOD

(71) Applicant: TSMC Solar Ltd., Taichung (TW)

(72) Inventors: Chung-Hsien Wu, Luzhu Township (TW); Chi-Yu Chiang, Taoyuan (TW); Shih-Wei Chen, Kaohsiung (TW); Wen-Tsai Yen, Caotun Township (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/916,852

(22) Filed: Jun. 13, 2013

(65) Prior Publication Data

US 2014/0370623 A1    Dec. 18, 2014

(51) Int. Cl.
   *H01L 21/31*      (2006.01)
   *H01L 21/469*     (2006.01)
   *H01L 31/18*      (2006.01)
   *H01L 31/032*     (2006.01)
   *H01L 21/66*      (2006.01)

(52) U.S. Cl.
   CPC ............ *H01L 31/18* (2013.01); *H01L 31/0322* (2013.01); *H01L 22/12* (2013.01)

(58) Field of Classification Search
   USPC ......... 438/765, 766, 753, 700, 680, 637, 608, 438/603, 604, 95; 257/396, 614, 615, 257/E21.006, E21.06, E21.077, E21.126, 257/E21, 127, E21.17, E21.267, E21.278, 257/E21.324
   See application file for complete search history.

(56) References Cited

U.S. PATENT DOCUMENTS

| | | | | |
|---|---|---|---|---|
| 4,358,472 | A * | 11/1982 | Small et al. | 427/10 |
| 4,369,876 | A * | 1/1983 | Small et al. | 198/460.3 |
| 7,189,654 | B2 * | 3/2007 | Yamazaki et al. | 438/706 |
| 8,053,174 | B2 * | 11/2011 | Yamazaki et al. | 430/312 |
| 8,241,699 | B2 * | 8/2012 | Okazaki et al. | 427/8 |
| 8,460,857 | B2 * | 6/2013 | Yamazaki et al. | 430/312 |

* cited by examiner

*Primary Examiner* — David Nhu
(74) *Attorney, Agent, or Firm* — Duane Morris LLP; Steven E. Koffs

(57) ABSTRACT

An evaporation apparatus comprises a chamber configured to contain at least one dispensing nozzle and at least one substrate to be coated. The chamber has at least one adjustable shielding member defining an adjustable aperture. The member is positioned between the at least one dispensing nozzle and the at least one substrate. The aperture is adjustable in at least one of the group consisting of area and shape. The at least one adjustable shielding member has a heater.

20 Claims, 9 Drawing Sheets

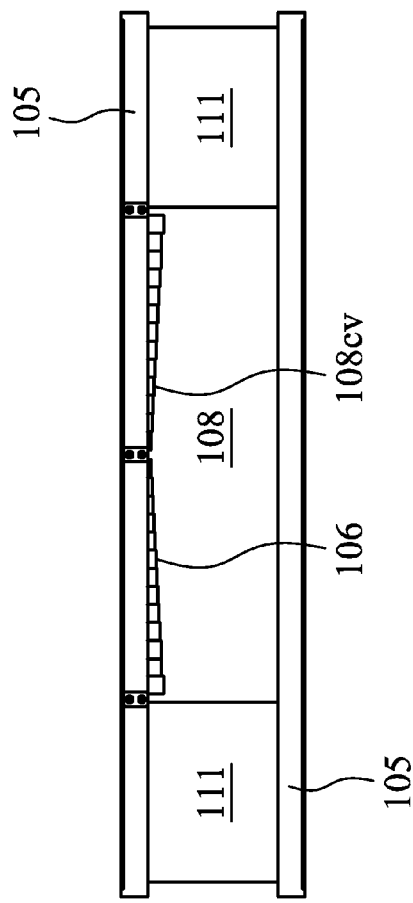
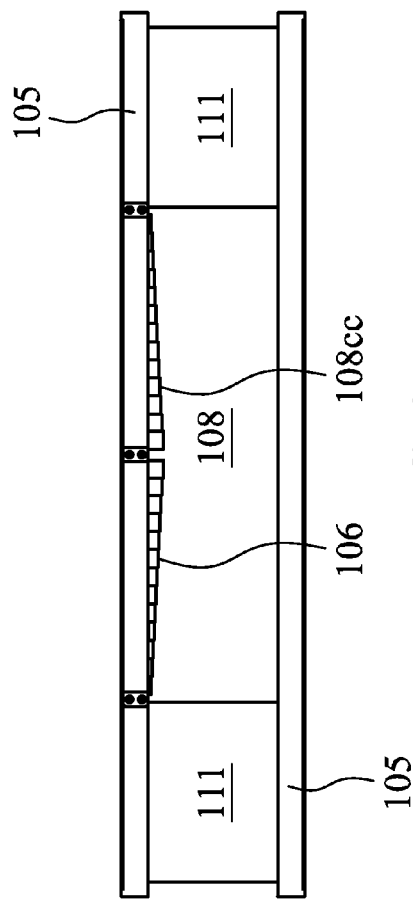
FIG. 8B
FIG. 9B
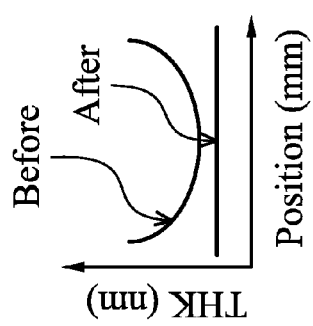
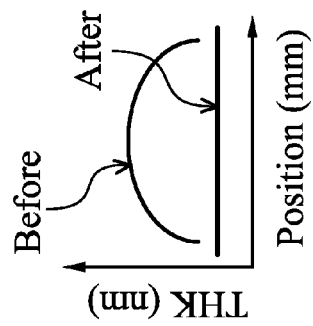
FIG. 8A
FIG. 9A

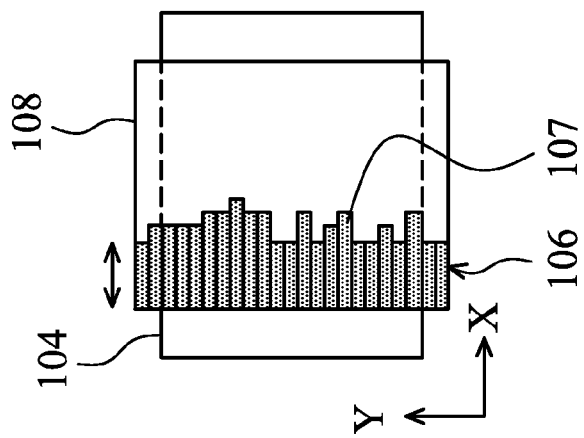
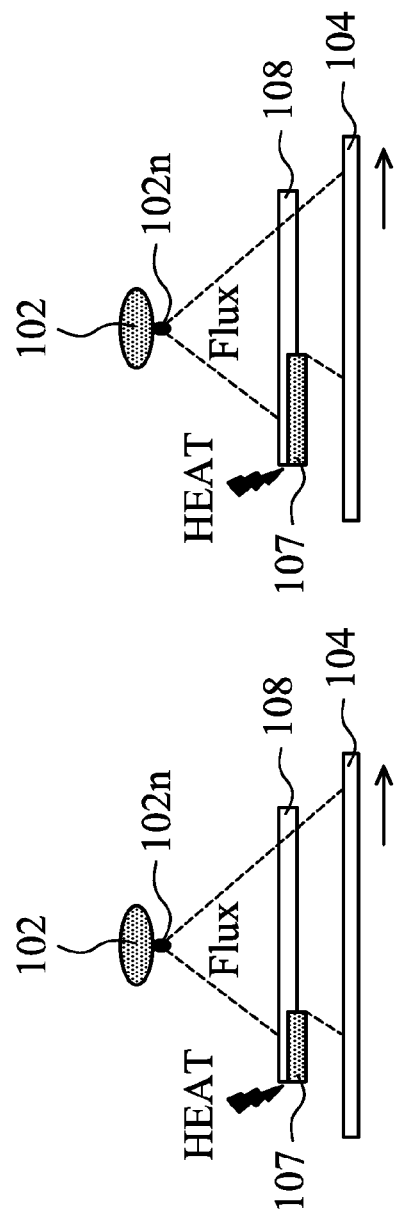
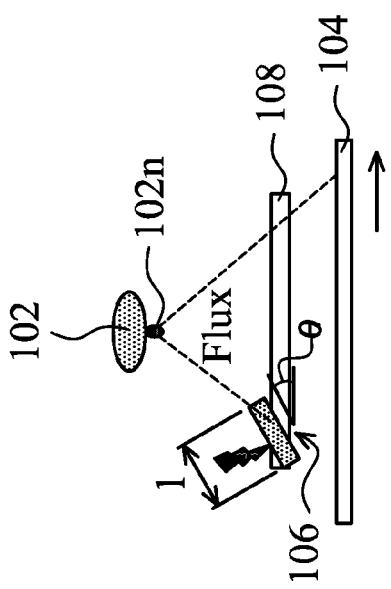
FIG. 10A
FIG. 10B
FIG. 10C
FIG. 11

EVAPORATION APPARATUS AND METHOD

FIELD

This disclosure relates to evaporation apparatus and methods for depositing thin films.

BACKGROUND

Photovoltaic cells or solar cells are photovoltaic components for direct generation of electrical current from sunlight. Due to the growing demand for clean sources of energy, the manufacture of solar cells has expanded dramatically in recent years and continues to expand. Various types of solar cells exist and continue to be developed. The solar energy collecting modules generally include large, flat substrates, on which a back contact layer, an absorber layer, a buffer layer, and a front contact layer are formed.

A plurality of solar cells are formed on one substrate, and are connected in series by respective interconnect structures in each solar cell to form a solar cell module. The absorber layer absorbs the sunlight that is converted into electrical current using the back contact layer. Semi-conductive materials are used in the manufacturing or fabrication of at least some known solar cells by being used as the material to form the absorber layer. Chalcopyrite based semi-conductive materials, such as copper indium gallium (di)selenide (CIGS), are used to form the absorber layer that is deposited onto the substrate.

However, there can be challenges and limitations in using such techniques. For example, when using co-evaporation, it can be difficult to uniformly evaporate metal elements, such as indium, gallium, and selenium over a wide area.

BRIEF DESCRIPTION OF THE DRAWINGS

FIG. 8A is a graph showing a coating thickness profile produced by the evaporation apparatus before and after adjusting the adjustable shielding member as shown in FIG. 8B.

FIG. 9A is a graph showing a coating thickness profile produced by the evaporation apparatus before and after adjusting the adjustable shielding member as shown in FIG. 9B.

FIGS. 10A-10C show actuation of individual slats of the adjustable shielding member of FIG. 1, to provide an asymmetrical aperture.

FIG. 11 shows a rotation of the adjustable shielding member of FIG. 1 to change the elevation angle of the shielding member.

DETAILED DESCRIPTION

Figure 1:
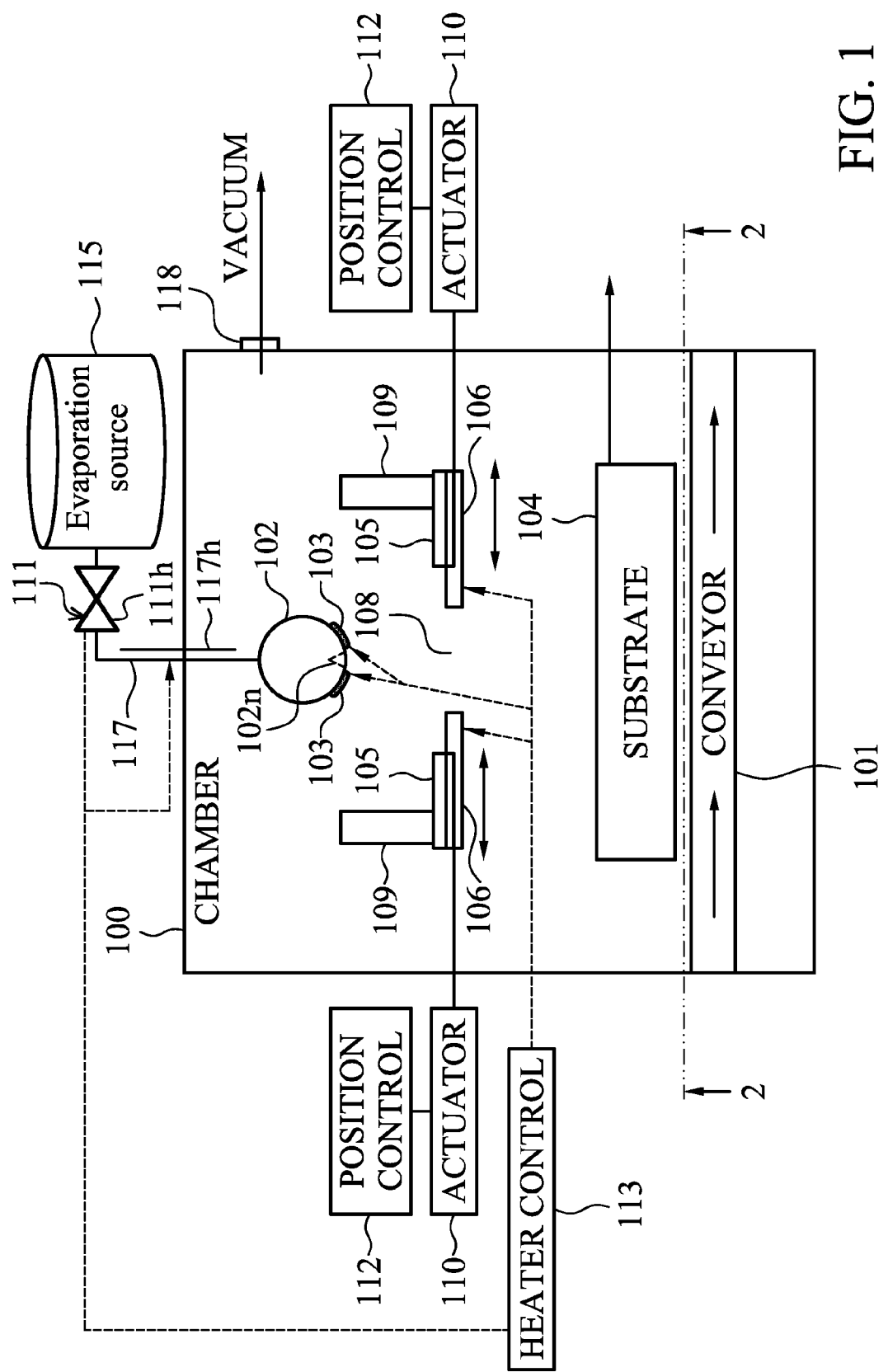
FIG. 1 is a schematic front view of an evaporation apparatus.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Methods and apparatus are described herein to improve thin film thickness uniformity by using at least one adjust shielding member or plate with a heater. The profile of the aperture area of the shielding plate can be adjusted by automated controls, or manually. The temperature of the at least one adjustable shielding member or plate can also be adjusted by automated controls or manually.

Figure 2:
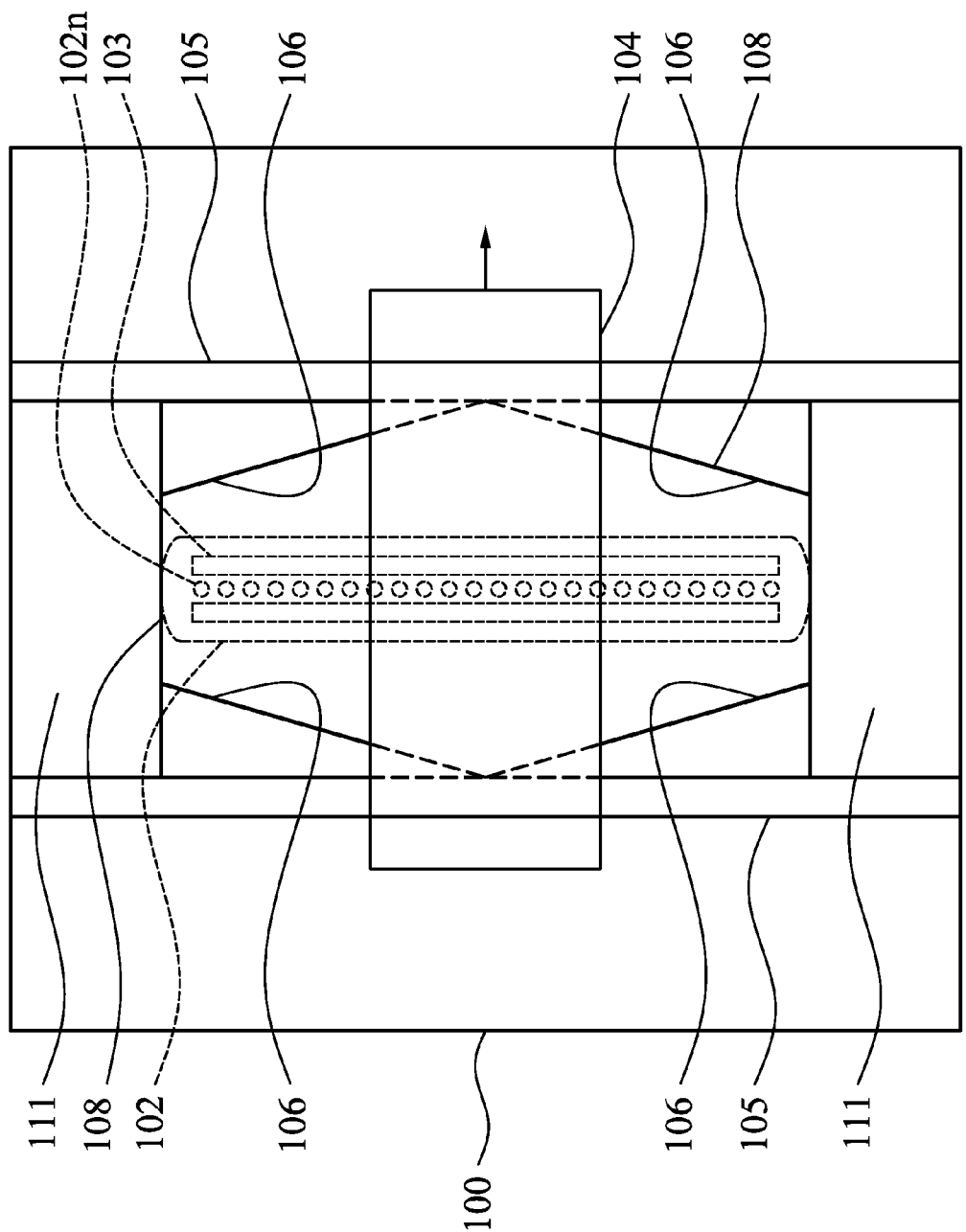
FIG. 2 is a schematic bottom plan view of the apparatus of FIG. 1, as seen from section line 2-2 of FIG. 1.

FIG. 1 is a schematic elevation view of a vapor deposition apparatus. FIG. 2 is a bottom plan view of the apparatus of FIG. 1. The apparatus 100 includes a chamber 100 configured to contain at least one manifold 102 having at least one dispensing nozzle 102n, and at least one substrate 104 to be coated with the vapor dispensed from the nozzle 102n. Although a cylindrical evaporation manifold 102 is shown, manifolds having other configurations (e.g., having one or more flat surfaces) can also be used.

The chamber 100, in which the deposition takes place, is maintained under vacuum by a suitable vacuum pump (not shown). A vacuum port 118 is provided for evacuating air from the chamber 100. The apparatus 100 is suitable for processing substrates 104 which are larger in surface area than the cross section of the aperture 108 through which the material to be deposited passes. Thus, in the case of a large substrate, such as a solar panel, material is not deposited over the entire surface area of the substrate 104 simultaneously. Substrates 104 are carried through the chamber 100 on an endless conveyor 101. Material is deposited on each region of the substrate 104 as that region passes under the aperture 108.

In some embodiments, as shown in FIG. 2, the manifold 102 has a plurality of nozzles 102n for delivering a vapor substantially uniformly across a width of the solar cell substrate. The width direction is normal to the motion of the conveyor 101, which conveys the substrate 104 past the manifold 102. The vapor is supplied from an evaporation source 115. In some embodiments, the evaporation source 115 includes a stainless steel tank, having an internal surface coated with titanium.

A gas conduit 117 connects the manifold 102 to the evaporation source. The conduit 117 can have a heater 117h on or adjacent thereto, to heat the conduit to a temperature above the melting point of the vapor to be conveyed by the conduit.

An electronically controllable gas valve 111 in the gas conduit 117 controls the vapor dispensing rate from the evaporation source 115.

In some embodiments, the substrate 104 is a thin film solar cell or a panel having a plurality of thin film solar cells. Such solar cells or panels 104 include a photovoltaic thin film which serves as light absorber material, formed over a substrate. Suitable materials for the underlying substrate include for example without limitation, glass (such as soda lime glass), ceramic, metals such as thin sheets of stainless steel and aluminum, or polymers such as polyamides, polyethylene terephthalates, polyethylene naphthalates, polymeric hydrocarbons, cellulosic polymers, polycarbonates, polyethers, combinations thereof, or the like. The absorber film is formed over substrate.

In some embodiments, the absorber material is copper indium gallium (di)selenide (CIGS), a I-III-VI$_2$ semiconductor material composed of copper, indium, gallium, and selenium. CIGS is a solid solution of copper indium selenide (often abbreviated "CIS") and copper gallium selenide. CIGS is a tetrahedrally bonded semiconductor, with the chalcopyrite crystal structure, and a bandgap varying continuously with x from about 1.0 eV (for copper indium selenide) to about 1.7 eV (for copper gallium selenide).

In an embodiment, the photovoltaic may comprise a p-type material. For example, the absorber layer can be a p-type chalcogenide material. In a further embodiment, the absorber layer can be a CIGS Cu(In,Ga)Se$_2$ material. In other embodiments, chalcogenide materials including, but not limited to, Cu(In,Ga)(Se,S)$_2$ or "CIGSS," CuInSe$_2$, CuGaSe$_2$, CuInS$_2$, and Cu(In,Ga)S$_2$. can be used as an absorber layer material. Suitable p-type dopants that can be used for forming absorber layer include without limitation boron (B) or other elements of group II or III of the periodic table. In another embodiment, the absorber layer may comprise an n-type material including, without limitation, cadmium sulfide (CdS).

In other embodiments, the photovoltaic material is amorphous silicon (a-Si), protocrystalline, nanocrystalline (nc-Si or nc-Si:H), black silicon. or other thin-film silicon (TF-Si), Cadmium telluride (CdTe), or Dye-sensitized solar cell (DSC) or other organic solar cell material.

In some embodiments, the adjustable shielding method and apparatus described herein are used for depositing one or more precursors (e.g., indium, gallium, and/or selenium) of the CIGS absorber layer. In some embodiments, the adjustable shielding method and apparatus described herein are used for depositing one or more other layers, besides the photovoltaic material.

For example, in some embodiments, a back electrode comprising an initial molybdenum (Mo) bilayer is first sputtered onto a glass, metal foil or polymer substrate as the first electrode layer. A P1 microchannel is scribed in the Mo layer. Then the photovoltaic (absorber) layer described above is deposited over the Mo layer. In some embodiments, a sodium layer is deposited over the back electrode from an evaporation source. In some embodiments, one or more of the absorber CIGS precursors are deposited by co-evaporation from one or more evaporation sources into the chamber. Then a buffer layer of CdS, AnS or InS is formed by sputtering, atomic layer deposition (ALD) or chemical-bath-deposition (CBD). The P2 microchannel is scribed. Then, the second electrode layer (e.g., a zinc oxide (i-ZnO) or Aluminum doped ZNO (AZO), boron-doped ZnO (BZO) is sputtered (or formed by Metal Organic Chemical Vapor Deposition, MOCVD) over the buffer layer. The P3 scribe line is then formed. In some embodiments, after the P3 scribing, the evaporation method can also be used to deposit an anti-reflective coating, such as magnesium fluoride (MgF$_2$). In various embodiments, the shielding method and apparatus described herein can be used for evaporation or co-evaporation of any one or more of the back electrode layer, absorber layer, the buffer layer, the front electrode layer and/or the anti-reflective coating layer.

The evaporation apparatus is also suitable for depositing material onto other types and sizes of substrates, including but not limited to semiconductor wafers.

Referring again to FIGS. 1 and 2, the chamber 100 has at least one adjustable shielding member 106 (e.g., at least one shielding plate) defining an adjustable aperture 108. The at least one member 106 is positioned between the at least one dispensing manifold 102 and the at least one substrate 104.

The aperture 108 is adjustable in at least one of the group consisting of area and shape. Some embodiments (e.g., FIGS. 3-9B) include one adjustable shielding member 106 along one of the longer side edges of aperture 108. Other embodiments (e.g., FIGS. 1-2) include respective adjustable shielding members 106 on each of the two long sides of the aperture 108. Other embodiments (not shown) include respective adjustable shielding members 106 on one or both of the two short ends of the aperture 108, adjacent the plates 111. As described below, the at least one adjustable shielding member 106 includes a heating element 107$h$ for heating the adjustable shielding member.

The dispensing manifold 102 has one or more dispensing nozzles 102$n$ and one or more heating elements 103. In some embodiments, the heating elements 103 are positioned locally, adjacent the nozzle(s) 102$n$ as shown in FIGS. 1 and 2. In other embodiments (not shown), the heating elements extend around the entire circumference of the manifold 102 (outside of the areas occupied by the nozzles 102$n$).

The dispensing manifold 102 is fluidly coupled to an evaporation source 115 by an appropriate gas conduit. A gas flow control valve 111 controls the flow rate of the precursor vapor to the chamber 100. In some embodiments, a heating element 111$h$ is applied to the valve 111. The valve 111 is selected to transmit vapor at temperatures in the range of the materials to be deposited. For evaporation deposition of indium, gallium, selenium and/or sulfur, the valve is configured to transmit vapor at temperatures in the range from about 200° C. to about 1000° C. The valve 111 can be of a type having interior surfaces coated with titanium. In some embodiments, the conduit 117 is heated by heater 117$h$ to a temperature above the melting point of the vapor, to prevent condensation or accumulation of the material in the conduit.

At least one heater control unit 113 is provided. In some embodiments, a single heater control unit 113 controls the heaters 103, 107$h$, 111$h$ and 117$h$. For example, for each type of material to be deposited, the heater control unit 113 has a respective predetermined setpoint temperature for the adjustable shielding plates 107, manifold 102, valve 111 and conduit 117. For closed loop control, the temperatures of plates 107, manifold 102, valve 111 and conduit 117 are sensed during vapor deposition, and the heater control unit controls supply of current to the heaters to maintain the temperatures at the setpoint. In some embodiments, the heater control unit 113 is a programmed general purpose processor. In other embodiments, the heater control unit 113 is an embedded microcontroller or microprocessor, or a programmable logic controller (PLC).

In other embodiments, up to four separate heater control units (not shown) are provided for controlling adjustable shielding plates 107, manifold 102 valve 111, and conduit 117, respectively.

As best seen in FIGS. 3-6, in some embodiments, the at least one adjustable shielding member 106 includes a plurality of independently movable slats 107, arranged parallel to each other along at least one side of the aperture 108. The slats 107 can be formed of a shielding material such as metal (e.g., carbon, molybdenum, stainless steel, stainless steel coated with Ti or Ni/Al), which blocks the vapor particles from the nozzle(s) 102n. The plurality of slats 107 on at least one side are spaced sufficiently close to each other, so that an edge defining the aperture is substantially continuous along ends of the plurality of slats, and the aperture is substantially continuous along the two opposite sides.

Thus, if there is a small gap (relative to the width of the slats) between each pair of adjacent slats 107, the size of aperture 108 is still effectively reduced, as the passage of vapor through any spaces between adjacent slats 107 is small.

Figure 4:
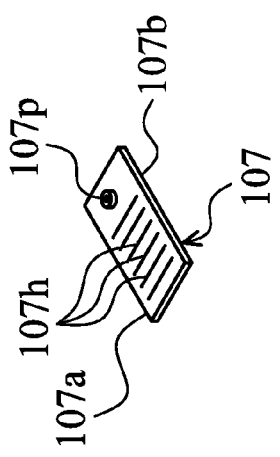
FIG. 4 is an isometric view of one of the slats of the adjustable shielding member shown in FIG. 3.

As shown in FIG. 4, each of the individual slats 107 of the adjustable shielding members 106 includes at least one heating element 107h. In various embodiments, the heating elements 107h can be a high resistance wiring or a discrete resistor, for example. The number, resistance and configuration of the heating elements 107h can be varied to accommodate the size, shape and heat capacity of each individual slat 107 and the desired temperature control range of the adjustable shielding members 106.

The inventor has determined that by heating the plates (slats 107), manifold 102, valve 111 and/or conduit 117 to a temperature above the melting temperature of the material to be deposited by evaporation on the substrate 104, condensation of the precursor materials on the plates, manifold and valve (and adhesion to these surfaces) can be avoided. Further, by avoiding condensation and adhesion of the material to the manifold, clogging of the nozzles 102n is avoided. Without the heating, clogging can be more severe near the vapor entrance to the manifold, which can lead to poor thickness uniformity. Heating the manifold can uniformly prevent clogging throughout the heated length of the manifold, eliminating a cause of poor thickness uniformity. Depending on which precursor is being deposited, the temperature of the plates (slats 107), manifold 102 and/or valve 111 can be set to a value from about 200° C. to about 1000° C.

Similarly, by heating the aperture shielding plates 107, adhesion of material on the plates is prevented. This prevents the plates from sticking to each other, and prevents changes to the dimensions of the plates due to accumulation of deposited material. Also, by heating the valve 111, adhesion of material on the fluid flow surfaces of the valve is prevented, so that the flow rate of the valve can be reliably controlled, and clogging of the valve is avoided. The efficiency of chalcopyrite-based cell can be enhanced by smooth morphology and compositional uniformity of chalcopyrite films.

Using the apparatus described herein, other causes of non-uniform film thickness can also be addressed. For example, in the event that one or more of the nozzles 102n are clogged, the aperture area of the adjustable shielding member 106 can be changed to compensate for the clogged nozzle(s) 102n, Similarly, the adjustable shielding members 106 any non-uniformity or deviation in thickness due to the residual amount of the evaporation source 115 and/or the opening percentage of the valve 111.

Figure 3:
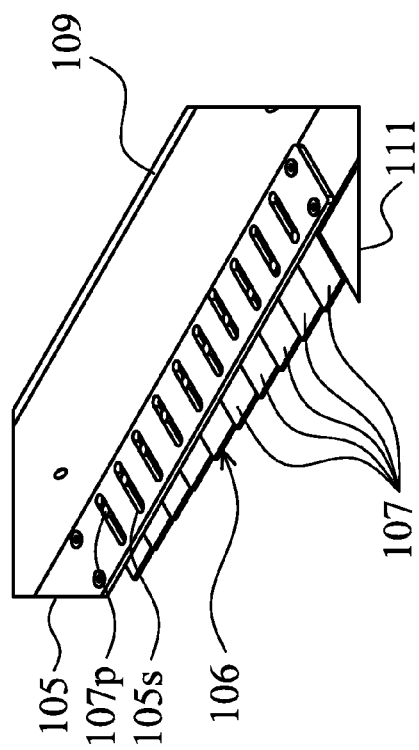
FIG. 3 is an isometric view of an adjustable shielding member as shown in FIG. 2.
Figure 7:
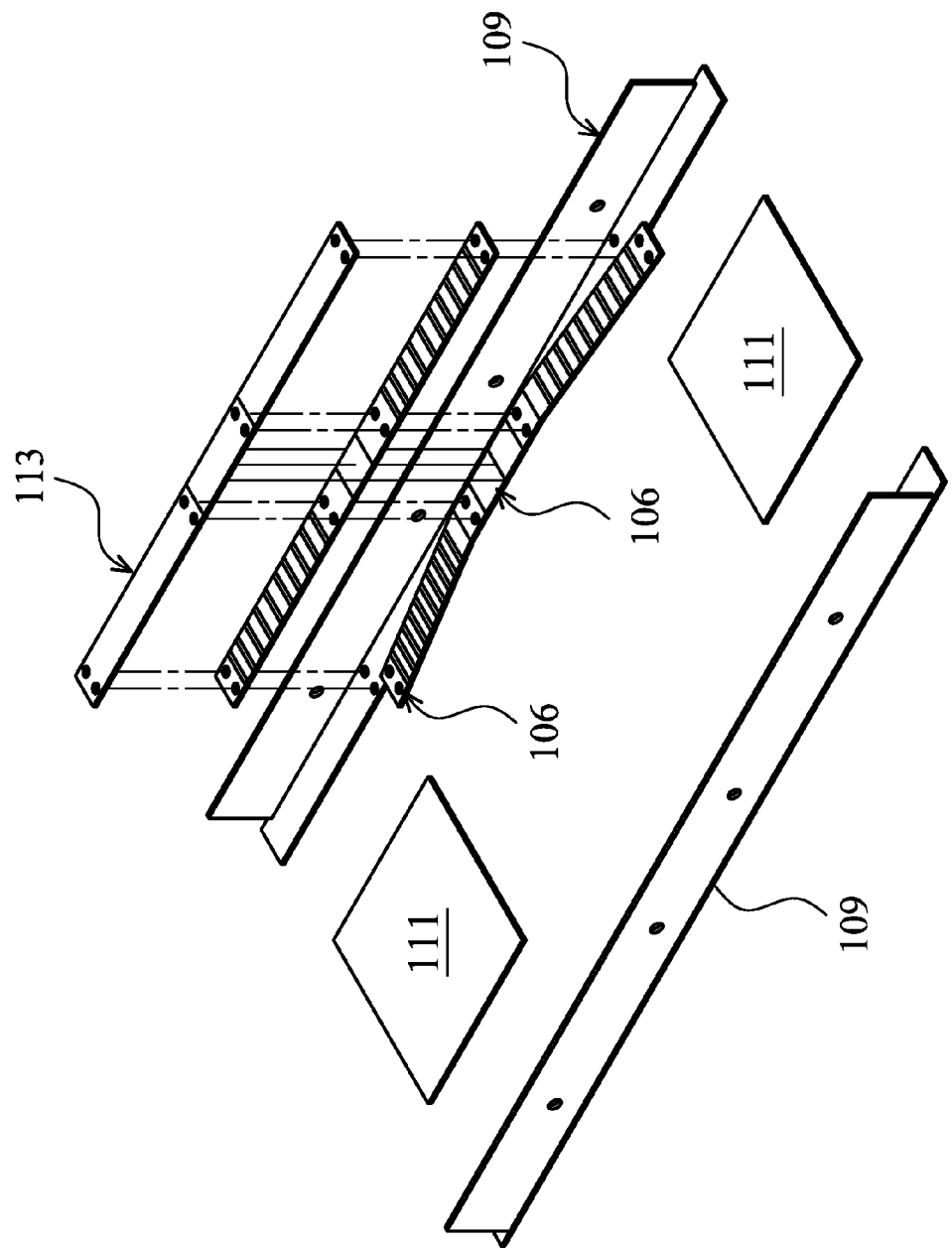
FIG. 7 is an exploded view of the aperture and adjustable shielding member of FIG. 1.

In FIG. 3, two opposite sides of the aperture 108 have a frame member 109. In some embodiments, the frame member is in the form of steel or aluminum angle stock. Each of the plurality of slats 107 has a guide mechanism 107p for guiding movement of that slat. In the example of FIG. 7, the guide mechanism is 107p is a projection. Each slat 107 has a projection 107p on its face, The projections 107p can have a variety of shapes, such as circular, elliptical, or rectangular. A plate 105 is mounted to the frame member 109 and has a plurality of slots 105s adapted to receive the projections 107p of respective plates. A shield plate 113 (FIG. 7) protects the plate 105, and prevents contamination by material from the evaporation source 115. In other embodiments (not shown), the plate 105 has a plurality of projections, and each slat 107 has a respective slot configured to receive a respective one of the projections.

In the example of FIG. 3, the slats are sized and spaced so that each slat slidably abuts the adjacent slats on either side. In some embodiments, the abutting side edges 107a, 107b are flat. In other embodiments, one side edge 107a of each slat 107 has a longitudinal groove, and the other side edge 107b has a longitudinal ridge or tongue sized and shaped to be received by the groove of an adjacent slat 107.

Figure 5:
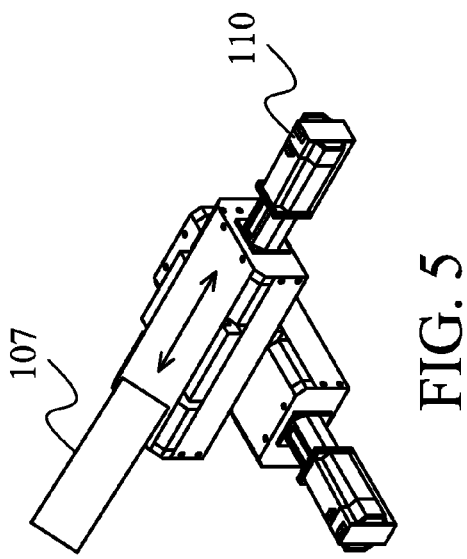
FIG. 5 shows a linear actuator or servomotor for positioning the slat of FIG. 4.
Figure 6:
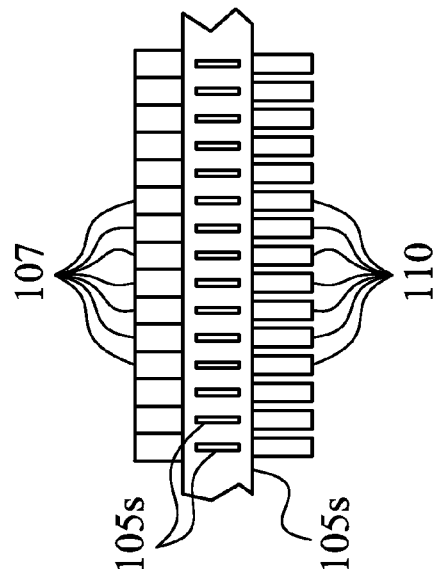
FIG. 6 shows a plurality of linear actuators or servomotors for positioning the slats of FIG. 3.

As best seen in FIGS. 5 and 6, the apparatus includes a respective linear actuator or servomotor 110 for each respective movable slat 107. The chamber 100 is configured to be operated at a partial vacuum pressure below atmospheric pressure; and the linear actuators or servomotors 110 are configured to be adjusted remotely while the chamber is at the partial vacuum pressure. Thus, adjustment and reconfiguration of the aperture 108 can be accomplished without opening the chamber 100 or breaking the vacuum.

The linear actuators or servomotors 110 can be controlled by a wired or wireless interface. In some embodiments, each actuator is coupled to a control unit 112. In some embodiments, the control unit 112 is a programmed general purpose processor. In other embodiments, the control unit is an embedded microcontroller or microprocessor, or a programmable logic controller (PLC). In other embodiments (not shown), the control unit 112 comprises a programmed processor, where the control unit 112 includes a program hosted on the same processor as the heater control unit 113.

In some embodiments, the control unit 112 sets the extension length of each actuator or servomotor 110 according to one of a predetermined set of profiles. For example, these profiles can include a convex aperture 108 (wider in the center than at the ends) as shown in FIG. 8B, or a concave aperture 108 (wider at the ends than at the middle) as shown in FIG. 9B).

As shown in FIG. 6, if the movable slats 107 are all fully retracted, the distal ends of the slats 107 form a straight line parallel to the plate 105, so that the aperture 108 defined by the adjustable shielding member 106 is substantially rectangular. The size of the aperture 108 can be adjusted (without changing aperture shape) by extending or retracting all of the slats 107 by an equal distance.

FIG. 3 shows the slats 107 arranged so that the extension of each respective slat 107 varies linearly from one end of the at least one adjustable shielding member 106 to the other end. Although there are small step increments of extension between adjacent slats 107, this arrangement approximates a straight diagonal line. The larger the number of slats in each side (and the smaller the width of each slat), the closer the edge of the aperture approaches a straight line or smooth curve shape. With straight edges on three sides of the aperture 108, and the arrangement of FIG. 3 substantially diagonal to the other three edges, the aperture 108 can be adjusted to have a substantially right trapezoidal shape.

FIG. 2 shows a configuration with adjustable shielding members 106 along each long side of aperture 108. The adjustable shielding members 106 can be configured so that the aperture 108 is wider at the center and narrower at the ends. In this configuration, the aperture 108 has a substantially hexagonal shape. If the thickness distribution is symmetrical before adjusting the aperture 108, it is useful to apply the same adjustment to the shielding members 106 on both opposite sides of the aperture 108.

FIG. 7 shows a configuration in which adjustable shielding member 106 is configured so that one of the longer sides of the aperture 108 is flat at the center and tapers off towards both ends. In other words, the profile of the shielding members is flat at the center and extends inward toward the center at each end. In this configuration, the aperture 108 has a substantially hexagonal shape. Further, if adjustable shielding members 106 are included along both longer sides of the aperture 108, and arranged in this configuration, an octagonal aperture can be formed.

FIG. 8B shows a configuration with an adjustable shielding member 106 along one long side of aperture 108. The adjustable shielding member 106 can be configured so that one of the longer sides of the aperture 108 is wider at the center and narrower at the ends. In this configuration, the aperture 108 has a substantially pentagonal shape. If uneven clogging of the nozzles 102n produces substantial differences between the film thickness on each side of the substrate, and the thickness of the coating before adjusting the shielding member 106 is asymmetric, then it may be advantageous to apply different adjustments on the shielding members 106 on opposite sides of the aperture, to reduce the asymmetry in the thickness. Thus, as shown in FIG. 8B, adjustment of the edge on one side of the aperture 108 can reduce the asymmetry in the thickness.

FIG. 9B shows the adjustable shielding member 106 adjusted so that the aperture 108cc is narrower at the center than at the ends. In a configuration having adjustable shielding members 106 on both of the long sides of the aperture 108, the aperture 108cc has an hourglass configuration.

These are just a few examples. The slats 107 can be arranged in other configurations as desired, for applying symmetrical or asymmetrical adjustments, depending on the thickness distribution observed prior to the adjustment. For example, using a second order polynomial to compute the extension length of each slat 107, a substantially elliptical aperture 108 is achieved.

FIGS. 10A-10C show an example of an asymmetrical adjustment. For example, upon applying a layer of material to the substrate 104 by evaporation, an in situ measurement may indicate that the thickness of the film is not uniform in the Y-axis direction (FIG. 10C), transverse to the direction of travel (X-axis direction). This non-uniformity can be addressed by adjusting the lengths of individual slats 107 to be shorter (FIG. 10A) or longer (FIG. 10B). As shown in FIG. 10C, the profile of the adjustable shielding member 106 can be irregular and non-monotonic, to correct a complex topology of the deposited film. Also, as shown in FIG. 10C, the aperture 108 can be asymmetrical. In the example of FIG. 10C, aperture 108 has an irregular trailing edge (left side) and a straight leading edge (right side). As indicated in FIGS. 10A-10B, the slats 107 of the adjustable shielding member 106 can be heated to a temperature above the melting point of the material deposited on the substrate 104, to prevent adhesion of the material on the adjustable shielding member 106.

FIG. 11 schematically shows another example, in which the adjustable shielding member 106 is rotatable about the Y-axis, to adjust the elevation angle of the adjustable shielding member 106. Because the projection of the adjustable shielding member 106 in the plane of the substrate 104 is $l*\cos\theta$, where l is the length of the shielding member, rotation of the shielding member 106 can reduce the projection of the shielding member in the plane of the substrate 104, and effectively increase the size of the aperture. As indicated in FIG. 11, the adjustable shielding member 106 can be heated to a temperature above the melting point of the material deposited on the substrate 104, to prevent adhesion of the material on the adjustable shielding member 106.

FIGS. 12A-12D show another example, in which the slats 107 of the adjustable shielding member 106 are individually rotatable.

Figure 12A:
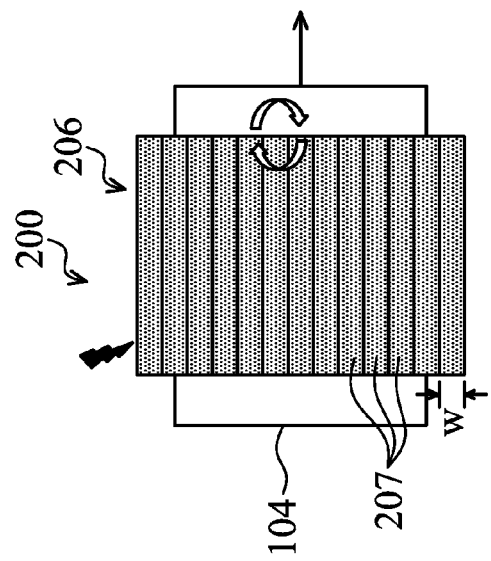
FIGS. 12A-12D show an embodiment of the adjustable shielding member having slats individually rotatable about the respective axis of each slat.
Figure 12C:
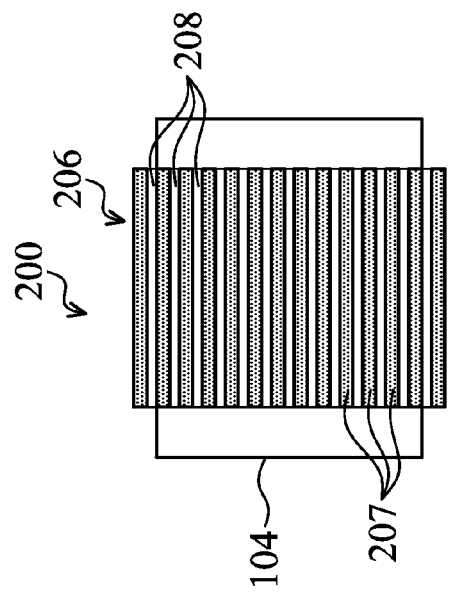
Figure 12B:
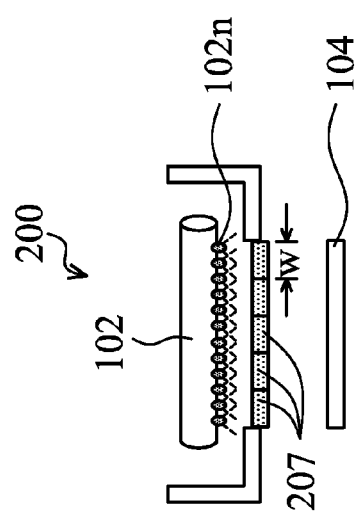

FIGS. 12A and 12B are side elevation and top plan views of an evaporation apparatus 200 with a an adjustable shielding member 206 comprising a plurality of elongated slats 207 extending across the aperture. With all of the slats 207 lying flat in and parallel to the substrate, the aperture is 100% closed.

Figure 12D:
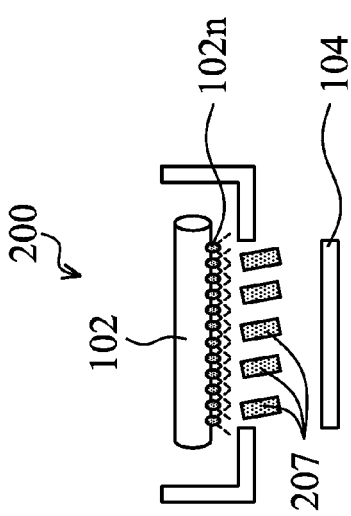

FIGS. 12C and 12D are side elevation and top plan views of an evaporation apparatus 200 with the individual slats 207 of the adjustable shielding member 206 rotated by an angle θ away from the horizontal position of FIG. 12A. For a slat of length l, the projection of each slat 207 in the plane of the substrate 104 is $w*\cos(\theta)$, where w is the width, and θ is the angle of rotation away from the horizontal position of FIG. 12A. By rotating each slat 207 individually, the width of each space 208 between adjacent slats 207 can be individually controlled. Thus, the distribution of the vapor can be varied to eliminate thickness non-uniformity of the deposited film.

Figure 13B:
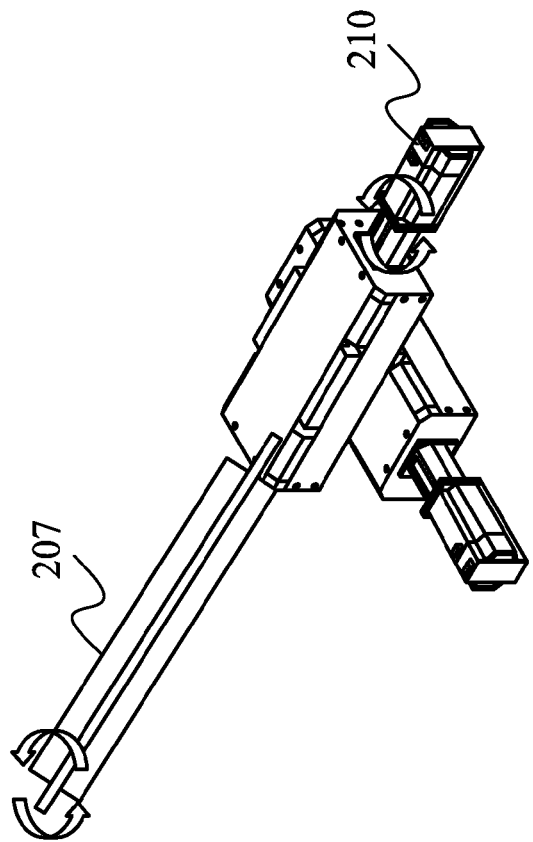
FIGS. 13A and 13B show servo mechanisms for rotating the slats of FIG. 11 and FIG. 12D, respectively.
Figure 13A:
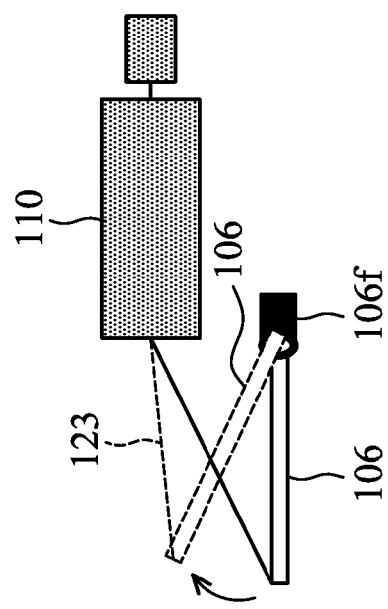

FIG. 13A shows an example of a mechanism for rotating the shielding member 106 of FIG. 11 about a fixed pivot point 106f. A linear actuator, such as a servomotor 110 can be connected by a linkage 123 to the adjustable shielding member 106. Thus, linear actuation of the servomotor 110 causes rotation of the shielding member 106 to the desired elevation angle. To provide finer granularity of control, each individual slat 107 can have a respective servomotor 110. In other embodiments, two or more of the slats 107 can be actuated by one servomotor, to reduce cost and complexity. The one or more servomotors 110 are connected to the controller 112 described above.

FIG. 13B shows an example of a mechanism for rotating the elongated slats 207 of the adjustable shielding member 206 in FIGS. 12A-12D. Each slat is rotated about its own respective longitudinal axis. The servomotor 210 is configured to rotate the slats 207 by a desired angle θ, as described above. To provide finer granularity of control, each individual slat 207 can have a respective servomotor 210. In other embodiments, two or more of the slats 107 can be connected by a linkage to the same servomotor 210, and rotated by the same servomotor. The one or more servomotors 210 are connected to the controller 112 described above.

Utilizing an adjustable shielding plate including a respective servomotor and a linkage mechanism, the aperture can be adjusted while the chamber 100 is in a vacuum state. There is no need to break the vacuum or open the chamber 100 to make adjustments.

Figure 14:
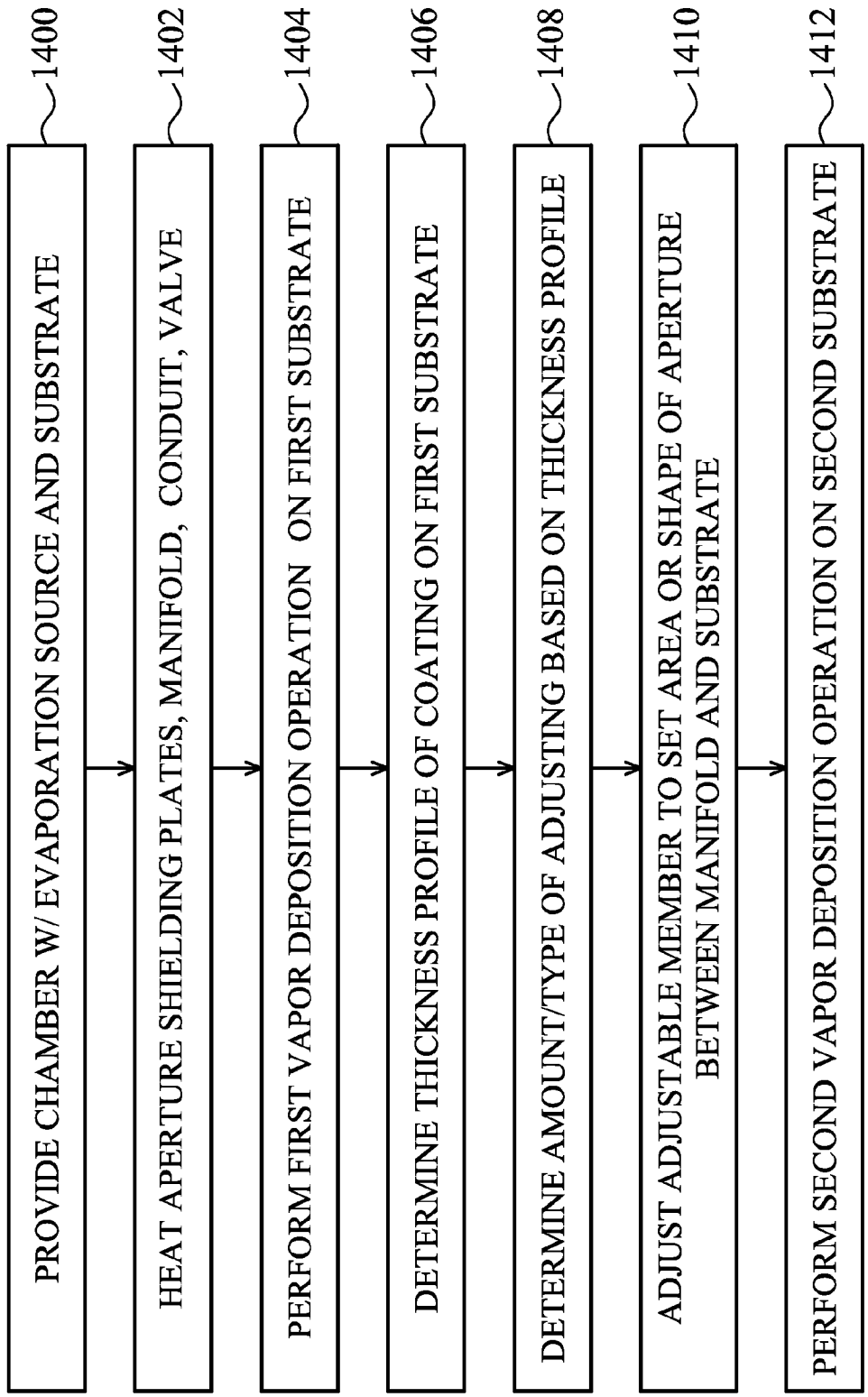
FIG. 14 is a flow chart of a method for adjusting the evaporation apparatus.

FIG. 14 is a flow chart of an example of a method of operating the apparatus.

At step 1400 a chamber is provided containing therein at least one dispensing nozzle and at least one substrate to be coated. The dispensing nozzle is included in a manifold coupled to an evaporation source by a suitable conduit. The conduit has a control valve between the evaporation source and the manifold. In some embodiments, the substrate is a soda lime glass panel for fabricating a solar panel.

At step 1402, at least one aperture shielding plate is heated. The aperture shielding plate can be included among a plurality of plates which together define an adjustable aperture. For example, the aperture shielding plates can be heated to a temperature which is above the melting point of the material to be deposited on the substrate. In some embodiments, at least a portion of the manifold 102 containing the vapor distribution nozzles 102*n* is also heated. In some embodiments, a gas delivery conduit 117 and a valve 111 that controls the delivery rate of the vapor to the chamber 100 is also heated. In some embodiments, each time a different material is deposited by evaporation, the heating temperature of the plates, manifold, conduit and/or valve are adjusted.

At step 1404, a first vapor deposition operation is performed on a first substrate in the chamber before performing an aperture adjustment.

At step 1406, a thickness profile of a coating deposited on the first substrate during the first evaporation operation is determined. A determination is made whether the thickness of the coating is greatest at a center of the substrate, at one end of the substrate, or at two opposite ends of the substrate.

At step 1408, an amount or type of the adjusting is determined based on the thickness profile of the first substrate. For example, as shown in FIGS. 8A and 8B, if the thickness profile of the coating deposited on the first substrate is thicker at an end of the substrate than at a center of the substrate (FIG. 8A), the adjusting is performed so that aperture 108 has at least one convex side 108*cv* after the adjusting (e.g., the top side of the aperture 108 in FIG. 8B). As another example, if the thickness profile of the coating deposited on the first substrate is thinner at an end of the substrate than at a center of the substrate, as shown in FIG. 9A, the adjusting is performed so that aperture 108 has at least one concave side 108*cc* (FIG. 9B) after the adjusting. In both of these cases, by providing an aperture 108 that is larger where the coating on the first substrate is thinner, and smaller where the coating on the first substrate is thicker results in a more uniform coating thickness for substrates subsequently having vapor deposition formed in the chamber.

In some embodiments, the control unit 112 determines whether the thickness of the coating is substantially uniform, thickest at the center, thickest at both ends, or monotonically increasing from one side to the other. If the thickness is uniform, a profile as shown in FIG. 6 is selected. If the thickness is thickest at the center, a profile as shown in FIG. 9B is selected. If the thickness is thinnest at the center, a profile as shown in FIG. 8B is selected. If the thickness is monotonically increasing, a profile as shown in FIG. 3 is selected. If the thickness is asymmetric and irregular, an irregular profile as shown in FIG. 10C can be selected.

Besides determining the shape of the aperture, the total area of the aperture can be adjusted by applying the same extension to each of the slats 107. This results in an up or down movement of the edge of the aperture, without changing the slope of the edge of the aperture.

At step 1410, the at least one adjustable shielding member is adjusted based on the determination of step 1408, to set at least one of the group consisting of an area and a shape of an aperture. The control unit 112 uses the selected profile from step 1408, and determines a position for each respective slat 107 of the adjustable shielding member 106. The control unit 112 then transmits control signals to the respective linear actuators/servomotors to cause each to move to the position for that slat 107 corresponding to the selected profile.

At step 1412, a second and/or subsequent vapor deposition operation is performed in the chamber after the adjusting. The first and second vapor deposition steps and the adjusting step are all performed under a partial vacuum. Thus, the adjusting can be performed without opening the chamber or breaking the vacuum. Although this example discusses one adjustment, the aperture area of the adjustable shielding member (shielding) can be changed multiple times, as appropriate, according to the changes of uniformity of vapor deposition (e.g., upon partial or complete clogging of any one or more of the nozzles 102*n* of the manifold 102). Further, with the adjustable shielding member 106 in place, other trimming methods are not needed.

Using these methods, improved coatings can be deposited and improved products fabricated. For example, the efficiency of a CIGS-based solar cell can be enhanced by smooth morphology and compositional uniformity of one or more CIGS precursors. The thickness uniformity in large-area, in-line vapor deposition is improved. Improved thickness uniformity is advantageous for producing quantities of high quality and high efficiency thin film solar cells. When used for CIGS-based solar cells, the method and structure improve Cu/(Ga+In) ratio (within panel uniformity). The CuInGa precursors are provided with a smooth surface morphology.

In some embodiments, evaporation apparatus comprises a chamber configured to contain therein at least one substrate to be coated and at least one dispensing nozzle coupled to an evaporation source. The chamber has at least one adjustable shielding member defining an adjustable aperture. The shielding member is positioned between the dispensing nozzle and a location of the substrate. The aperture is adjustable in at least one of the group consisting of area, shape, and orientation. The at least one adjustable shielding member has a heater.

In some embodiments, the chamber has a conveyor for moving the substrate past the aperture while the substrate is being coated.

In some embodiments, the at least one adjustable shielding member includes a plurality of independently movable slats, arranged along at least one side of the aperture.

Some embodiments further comprises a respective linear actuator or servomotor for each respective movable slat.

In some embodiments, the chamber is configured to be operated at a partial vacuum pressure below atmospheric pressure; and the linear actuators or servomotors are configured to be adjusted remotely while the chamber is at the partial vacuum pressure.

Some embodiments further comprise a control unit configured to operate the linear actuators or servomotors.

Some embodiments further comprise at least one heater on or adjacent to a manifold containing the nozzle, a conduit conveying the vapor to the manifold or a valve that controls supply of a vapor to the nozzle.

Some embodiments further comprise a control unit configured to control supply of current to the at least one heater.

In some embodiments, the at least one adjustable shielding member includes a plurality of independently movable slats, arranged along each of at least two opposite sides of the aperture.

In some embodiments, the slats are positionable to individually rotate each slat around a longitudinal axis thereof.

In some embodiments, the at least one adjustable shielding member includes at least one movable plate on a first side of the aperture, the at least one movable plate having at least one edge that is neither parallel to nor perpendicular to a second side of the aperture, the second side of the aperture adjacent the first side of the aperture.

In some embodiments, evaporation apparatus comprises a chamber configured to contain therein at least one substrate to be coated and at least one dispensing nozzle coupled to an evaporation source. A plurality of movable plates are positioned between the at least one dispensing nozzle and a position of the at least one substrate, the plates defining an adjustable aperture, at least one of the plates having a heater.

In some embodiments, the at least one movable plate includes a plurality of independently movable slats, arranged along each of at least one side of the aperture. The apparatus further comprises a respective linear actuator or servomotor for each respective movable slat, the chamber configured to be operated at a partial vacuum pressure below atmospheric pressure, and the linear actuators or servomotors configured to be adjusted remotely while the chamber is at the partial vacuum pressure.

In some embodiments a method comprises providing a chamber containing therein at least one substrate to be coated and at least one dispensing nozzle coupled to an evaporation source; adjusting at least one adjustable shielding member to set at least one of the group consisting of an area and a shape of an aperture, the member positioned between the at least one dispensing nozzle and the at least one substrate; and heating the at least one adjustable shielding member before or simultaneously with dispensing a vapor from the nozzle onto the substrate.

In some embodiments, the at least one adjustable shielding member is heated to a temperature of at least a melting temperature of a material of which the vapor is comprised.

Some embodiments further comprise heating a manifold containing the nozzle, a conduit that conveys the vapor to the manifold, or a valve that controls supply of the vapor to the nozzle before or simultaneously with dispensing a vapor from the nozzle onto the substrate.

Some embodiments further comprise performing a first dispensing operation to coat a first substrate in the chamber before the adjusting; determining a thickness profile of a coating deposited on the first substrate during the first dispensing operation; determining an amount or type of the adjusting based on the thickness profile; and performing a second dispensing operation on a second substrate in the chamber after the adjusting.

In some embodiments, the adjusting is performed so that aperture has at least one convex side after the adjusting, if the thickness profile of the coating deposited on the first substrate is thicker at an end of the substrate than at a center of the substrate.

In some embodiments, the adjusting is performed so that aperture has at least one concave side after the adjusting, if the thickness profile of the coating deposited on the first substrate is thinner at an end of the substrate than at a center of the substrate.

In some embodiments, the first and second dispensing steps and the adjusting step are all performed under a partial vacuum.

The control methods and control units 112 described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. Evaporation apparatus, comprising:
a chamber configured to contain therein at least one substrate to be coated and at least one dispensing nozzle coupled to an evaporation source;
the chamber having at least one adjustable shielding member defining an adjustable aperture, the adjustable shielding member positioned between the dispensing nozzle and a location of the substrate, the aperture being adjustable in at least one of the group consisting of area, shape, and orientation, the at least one adjustable shielding member having a heater thereon.

2. The evaporation apparatus of claim 1, wherein the chamber has a conveyor for moving the substrate past the aperture while the substrate is being coated.

3. The evaporation apparatus of claim 1, wherein the at least one adjustable shielding member includes a plurality of independently movable slats, arranged along at least one side of the aperture.

4. The evaporation apparatus of claim 3, further comprising a respective linear actuator or servomotor for each respective movable slat.

5. The evaporation apparatus of claim 4, wherein:
the chamber is configured to be operated at a partial vacuum pressure below atmospheric pressure; and
the linear actuators or servomotors are configured to be adjusted remotely while the chamber is at the partial vacuum pressure.

6. The evaporation apparatus of claim 4, further comprising a control unit configured to operate the linear actuators or servomotors.

7. The evaporation apparatus of claim 6, further comprising at least one heater on or adjacent to a manifold containing the nozzle, a conduit conveying the vapor to the manifold, or a valve that controls supply of a vapor to the nozzle.

8. The evaporation apparatus of claim 7, further comprising a control unit configured to control supply of current to the at least one heater.

9. The evaporation apparatus of claim 1, wherein the at least one adjustable shielding member includes a plurality of independently movable slats, arranged along each of at least two opposite sides of the aperture.

10. The evaporation apparatus of claim 9, wherein the slats are positionable to individually rotate each slat around a longitudinal axis thereof.

11. The evaporation apparatus of claim 1, wherein the at least one adjustable shielding member includes at least one movable plate on a first side of the aperture, the at least one movable plate having at least one edge that is neither parallel to nor perpendicular to a second side of the aperture, the second side of the aperture adjacent the first side of the aperture.

12. Evaporation apparatus, comprising:
a chamber configured to contain therein at least one substrate to be coated and at least one dispensing nozzle coupled to an evaporation source; and
a plurality of movable plates positioned between the at least one dispensing nozzle and a position of the at least one substrate, the movable plates defining an adjustable aperture, at least one of the movable plates having a heater thereon.

13. The evaporation apparatus of claim 12, wherein:
the at least one movable plate includes a plurality of independently movable slats, arranged along each of at least one side of the aperture;
the apparatus further comprises a respective linear actuator or servomotor for each respective movable slat, the chamber configured to be operated at a partial vacuum pressure below atmospheric pressure, and the linear actuators or servomotors configured to be adjusted remotely while the chamber is at the partial vacuum pressure.

14. A method of using an evaporation apparatus, comprising:
providing a chamber containing therein at least one substrate to be coated and at least one dispensing nozzle coupled to an evaporation source;
adjusting at least one adjustable shielding member to set at least one of the group consisting of an area and a shape of an aperture, the member positioned between the at least one dispensing nozzle and the at least one substrate; and
heating the at least one adjustable shielding member using a heater on the adjustable shielding member, before or simultaneously with dispensing a vapor from the nozzle onto the substrate.

15. The method of claim 14, wherein the at least one adjustable shielding member is heated to a temperature of at least a melting temperature of a material of which the vapor is comprised.

16. The method of claim 14, further comprising:
heating a manifold containing the nozzle, a conduit conveying the vapor to the manifold, or a valve that controls supply of the vapor to the nozzle before or simultaneously with dispensing a vapor from the nozzle onto the substrate.

17. The method of claim 14, further comprising
performing a first dispensing operation to coat a first substrate in the chamber before the adjusting;
determining a thickness profile of a coating deposited on the first substrate during the first dispensing operation;
determining an amount or type of the adjusting based on the thickness profile; and
performing a second dispensing operation on a second substrate in the chamber after the adjusting.

18. The method of claim 17, wherein the adjusting is performed so that aperture has at least one convex side after the adjusting, if the thickness profile of the coating deposited on the first substrate is thicker at an end of the substrate than at a center of the substrate.

19. The method of claim 17, wherein the adjusting is performed so that aperture has at least one concave side after the adjusting, if the thickness profile of the coating deposited on the first substrate is thinner at an end of the substrate than at a center of the substrate.

20. The method of claim 17, wherein the first and second dispensing steps and the adjusting step are all performed under a partial vacuum.

* * * * *